United States Patent [19]

Delorme

[11] 4,411,149
[45] Oct. 25, 1983

[54] MACHINE FOR BENDING CONDUCTORS OF A SEMICONDUCTOR CHIP DEVICE

[75] Inventor: Raymond L. Delorme, Bagnolet, France

[73] Assignee: Compagnie Internationale pour l'Informatique Cii Honeywell Bull, Paris, France

[21] Appl. No.: 326,591

[22] Filed: Dec. 2, 1981

[30] Foreign Application Priority Data

Dec. 5, 1980 [FR] France ............................ 80 25856

[51] Int. Cl.³ .......................................... B21D 5/01
[52] U.S. Cl. .................................... 72/385; 29/741; 228/5.1; 228/6 A; 228/15.1
[58] Field of Search ............... 72/385, 380; 228/5.1, 228/6 A, 13, 15.1; 29/741

[56] References Cited

U.S. PATENT DOCUMENTS

| | | | |
|---|---|---|---|
| 3,724,068 | 4/1973 | Galli | 228/6 A |
| 3,887,783 | 6/1975 | Comette | 228/6 A |
| 3,949,925 | 4/1976 | Keizer | 228/6 A |
| 4,010,885 | 3/1977 | Keizer | 228/6 A |
| 4,099,660 | 7/1978 | Schultz | 228/13 |
| 4,109,096 | 8/1978 | Dehaine | 174/68.5 |
| 4,166,562 | 9/1979 | Keizer | 29/741 |
| 4,236,301 | 12/1980 | Hug | 29/741 |

FOREIGN PATENT DOCUMENTS

2223345 5/1972 Fed. Rep. of Germany ........ 29/741
2299724 1/1975 France .

OTHER PUBLICATIONS

IBM Technical Disclosure Bulletin, vol. 19, No. 11, 4-1977, New York (U.S.) E. Perls "Air Track", pp. 4184–4185.

Primary Examiner—Gene Crosby
Attorney, Agent, or Firm—Kerkam, Stowell, Kondracki and Clarke

[57] ABSTRACT

The invention relates to an automatic machine for bending the extending conductors of an integrated circuit chip to form contacts for mounting the chip to a substrate. This machine comprises a bending base (20), movable bending pieces (18, 19) situated opposite the bases, a ribbon insulating support (2) for the chip (1), and a platform (27) to displace the support of the chip so as to being the chip onto the base, or to remove it therefrom. This machine is characterized in that the bending base (20) includes a housing (21) having the form of the chip for receiving the chip and having a plane rim (23) adapted to surround the body of the chip. The first movable piece (18) is located in the second movable piece and has a flat rim (24) opposite the flat rim (23) of the base. The extending conductors are wedged during the bending operation between these two rims (23, 24) and the bending is carried out by the second movable piece (19) which moves rectilinearly in a vertical direction.

17 Claims, 9 Drawing Figures

MACHINE FOR BENDING CONDUCTORS OF A SEMICONDUCTOR CHIP DEVICE

BACKGROUND OF THE INVENTION

1. Field of the Invention

The present invention relates to an automatic machine for bending connectors of micro chips having integrated circuits for connection of these circuits to a printed circuit on a substrate support.

2. Background of the Invention

Electronic equipment frequently utilizes assemblies for the handling of information which incorporates open integrated circuits mounted to circuit boards. These open integrated circuits may be in the form of chips or micro chips which are usually of rectangular or square shape with their sides measuring several milllimeters.

To facilitate the handling of these chips which are very small in size and to facilitate their control during mounting to a connection substrate having printed circuits thereon, these chips are mounted on an insulating support such as a flexible ribbon of inextensible insulating material provided with laterally regularly spaced perforations which enables it to be driven between operating stations by suitable processing apparatus. Equidistant openings are at the center of the ribbon over which the chips are located. These chips are maintained in the openings by an assembly of conductors which are disposed fan-wise around each of them and which are connected between contact points on the chip and the insulating support while sustaining each chip in the opening to which it corresponds. Generally, to obtain the conductors which connect the points with the edges of the openings in the support or insulating ribbon, a ribbon of copper of several hundred millimeters thickness is laminated on a ribbon in which the openings have been already cut. In each of these windows, the conductive ribbon of copper is etched, for example, chemically, in such a way as to leave only conductive bands which form the aforesaid conductors. These conductors extend to the edges of each window and abut the points of the integrated circuit chip or wafer placed at the center of the opening. Each extremity of these conductors is soldered to one of the connection points of the chip under consideration. It follows that the chips are thus solidly connected to the ribbon serving as a support and, when it is desired to detach one of the chips from their ribbon it is only necessary to cut the conductors which connect it to the ribbon at a certain distance from its edges, after a preliminary bending of the conductors. This bending of the conductors forms connectors that facilitate the connection of the chips on a connection substrate whichin itself is a delicate operation. Generally, to avoid during this operation the preliminary detachment of the extremities of the conductors soldered to the points of each chip from these points, it is known to provide on each of the conductors near the edge of each opening in the ribbon a structure for decreasing the mechanical stresses to which the conductors are subjected. This stress reducing structure is constituted, for example, by a ring which absorbs the forces of elongation to which the conductors are subjected during bending. Connection points are formed in each portion of the conductor which extend between the corresponding ppooooints of the chip and the neighborhood of the structure for decreasing the mechanical forces.

It is known to bend the conductors by means of an automatic machine which comprises a bending base and movable bending means situated with respect to this base. Generally, when the chip support is a ribbon, this ribbon is preliminarily cut at regular intervals between the chips in such a way that each portion of the ribbon thus obtained has an opening at the center at which is located the chip. This portion of the ribbon is then fixed in a body, and the bending of the connectors of the chips is then carried out by presenting each portion including the opening over which the chip is supported in the bending machine. In this machine, means are provided for displacing the chip support so as to move this chip on to the base in a perpendicular direction to the chip and to remove the chip from the base after bending. In this type of machine, mechanical means comprising a steel ram, for example, positions and maintains the chip in position on the base during the bending operation. Movable matrices curve the conductors in such a way as to form the contacts in a direction perpendicular to the chip.

This type of machine has numerous disadvantages. Firstly, it is necessary to cut the ribbon supporting the chips in regular portions so that each includes a chip having conductors which are to be bent to form the contacts. Each of these portions should be, before bending, properly inserted in a body and it is only after this mounting that the contacts of each of the chips are bent. These operations require careful manipulation and are slow and do not permit the bending operations to be carried out in long series. Another inconvenience results from the fact that the chips are positioned and maintained during the bending opration by a metallic ram which bears on the surface of the chip. This risks damage to the integrated circuits on each chip. Finally, in this type of machine, the bending matrices may damage the solder connections between the extremities of the conductors and the contact points of the chip because the solder connections are subjected to forces which could destroy them. These forces are only partially absorbed by the force reducing structures mentioned above.

SUMMARY OF THE INVENTION

The object of the present invention is to correct these inconveniences and notably to provide an automatic machine for bending conductors of chips having integrated circuits thereon to form connectors in a manner which makes it possible to successively move, without preliminary cutting, the support or ribbon on which the chips are mounted, and in which means are provided to wedge the contacts of the chip adjacent the perimeter thereof during bending to prevent the solder connections of the extremities of the conductors on the contact points of each of the chips from being subjected to forces which might destroy these solder connections. Finally, this machine in accordance with the invention utilizes pneumatic means for positioning the chips on the bending base to prevent damage to the integrated circuits during the bending operation.

Another object of the present invention is to provide an automatic bending machine for forming contacts for at least one chip having integrated circuits thereon adopted to be mounted on a connection substrate wherein the chip is preliminarily mounted on an insulating support provided with at least one opening, at the center of which the chip is located, conductors connecting the contact points of the chip with the insulating support while holding the chip in the opening. The contact represents a portion of conductor which extends from the corresponding point where the conductor is bent to the neighborhood of a structure for decreasing the mechanical forces. The machine includes a bending base, movable bending means situated with respect to the base, means for displacing the chip support and for bringing each chip on the base in a direction perpendicular to the chip and in a first direction, and for removal of the chip after bending, in the said perpendicular direction and in a second direction opposed to the first direction, and means for positioning the chip on the base. The invention is particularly characterized in that the bending base comprises a housing of which the perimeter has the shape corresponding to the perimeter of the chip and a flat rim which enters in contact with the contacts to be bent, at the neighborhood of the perimeter of the chip, and in that the movable bending means comprises a first piece movable in the said perpendicular direction and in the first and second directions. This first piece has a flat rim corresponding to the flat rim of the base and is situated with respect to the base in such a way as to wedge the contacts of the chip in the vicinity of the perimeter of the chip during bending. A second piece movable in the said perpendicular direction and in the two directions surrounds the first piece and bends the conductors in such a way as to form contacts having a bend which takes the form of the edge of the rim of the base. A linear part extends from this bend in a substantially perpendicular direction to the chip. This linear part continuously connects with the remaining portion of the conductor situated between this linear part and the insulating support. The first piece moves in the second piece, while elastic means are interposed between these two pieces to apply to the first piece a force opposing relative movement of the first piece with respect to the second.

In accordance with another feature of the invention, the means for positioning the chip on the bending base are constituted by pneumatic control means to control the position of the chip. The means is situated in the first piece and applies a jet of gaseous fluid under pressure against the chip sufficient to hold the chip in its housing.

In accordance with another feature of the invention, the means for positioning the chip on the bending base further comprises automatic means for monitoring the presence of the chip, as well as the condition or state of the chip.

In accordance with another feature of the invention, the presence control is constituted by pneumatic control means which applies on the chip a jet of gaseous fluid, the pressure of which is less than that of the jet of gaseous fluid used for positioning. The pneumatic means for controlling the presence and for controlling the state and position of the chip further comprises a pressure receiver connected to the support of the base and means for detecting a level of pressure associated with this receiver to stop bending in case of poor positioning of the chip in it housing in the base, and to indicate an incident in case of absence of a chip or if this chip has a poor surface condition.

In accordance with another feature of the invention, the output of the detector or receiver is connected to means for displacing the chip support so as to stop the machine in case of an incidence requiring the process to cease.

In accordance with still another feature of the invention, the support of the chip is a flexible ribbon of insulating inextensible material provided with lateral driving perforations and spaced central openings in which the chips are located. The chips are mounted to follow each other in a linear direction parallel to the edges of the ribbon. Means for moving the support is constituted by step by step driving apparatus acting on the lateral perforations to displace the ribbon in the linear direction. To bring each chip successively into position with respect to the base, a means for bringing the chip onto the bending base comprises a base for positioning the ribbon, this base having linear guiding means for movement in the direction perpendicular to the chip in the first and second directions and an opening with respect to the support for the bending base. The second movable bending piece includes projections to engage in perforations of the bend which are adjacent each chip situated with respect to the bending base and to engage in housings in the positioning platform. With respect to these projections, this second bending piece further comprises elastic means to place the ribbon on the positioning platform, during movement of the first and second pieces in the first direction to effect bending and during displacement of these pieces in the second direction, until the projections are disengaged from the perforations after bending.

In accordance with yet another feature of the invention, a means for linear guiding and for decreasing the movement of the platform are provided. The linear guide means is connected to the platform and is parallel to the said perpendicular direction to the chip. The elastic means for decreasing movement is situated between the platform and a frame connected to the bending base. The decreasing means further comprises a pneumatic brake arranged to act on the linear guide.

In accordance with a further feature of the invention, the elastic means for placing the ribbon on the positioning base are constituted by mounting finger springs carried by the second movable bending piece and acting in the said direction perpendicular to the chip.

In accordance with still a further feature of the invention, the machine comprises pneumatic control means for the displacement of the first and second movable bending pieces in a direction perpendicular to the chip and in the first and second directions.

In accordance with another feature, the pneumatic means for controlling the state and for positioning the chip are situated in the first movable piece and are constituted by a first air shaft formed in the first movable piece and adapted to be fed with the gaseous fluid under pressure.

In accordance with another characteristic, the pneumatic means for controlling the presence of the chips employs pressure of gaseous fluid and comprises a second duct situated in the first duct having an orifice or a dimension less than that of the first duct and fed by the same gaseous fluid under pressure. The housing of the base comprises a conduit connected to the pressure receiver.

BRIEF DESCRIPTION OF THE DRAWINGS

Other features and advantages of the invention will appear further from the description which follows given with reference to the accompanying figures, in which.

DESCRIPTION OF THE PREFERRED EMBODIMENTS

Figure 1:
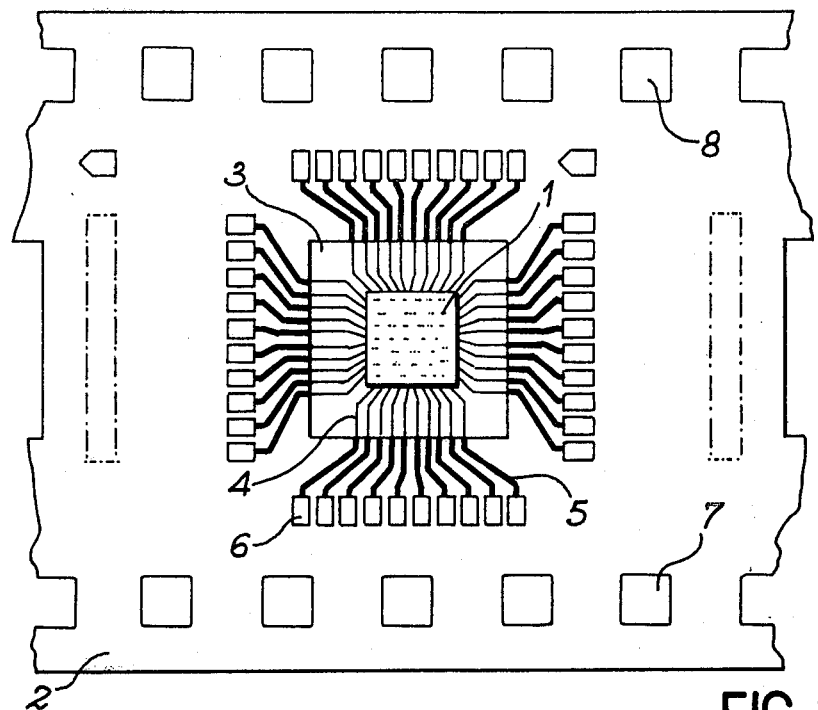
FIG. 1 shows an insulating support in the form of a perforated ribbon provided with openings over which an integrated circuit chip is mounted.

FIG. 1 shows an integrated circuit chip 1 which can be described as a micro chip mounted on an insulating support 2 provided with at least an opening 3 at the center of which the chip is located. Conductors 4 connect the contact points of the circuits of chip 1 with the conductors of insulating support 2 while holding the chip in opening 3. These conductors extend on the insulating support 2 as conducting bands 5 and are connected to contact zones 6 formed on the insulating support. In known manner, the conductors 4, the conducting bands 5 and the contact zones 6 can be obtained by laminating a band of copper on the support 2, then chemically etching this band to form the conductors, the conductive bands and the zones of contact. In a further step, the three extremities of the conductors 5 are connected to the contact points of the chip 1 (not shown). The insulating support 2 can be formed in known way by a flexible inextensible insulating ribbon such as for example a polyamide material fabricated and sold by DuPont de Nemours under the name of "KAPTON" (trademark). This ribbon comprises in addition to the regularly spaced openings, lateral perforations 7, 8, regularly spaced and destined to control movement of the ribbon 2 by appropriate apparatus. The contact zones 6 are provided primarily for control of the function of the integrated circuits on the chip when the chip is mounted on a connecting plate such as a printed circuit card, for example. In this figure, it is presumed that the circuits are situated on the face of the chip which is seen in the figure. The thickness of the insulating ribbon 2 is on the order of several hundreds of millimeters while the chip has dimensions of several millimeters and the conductors which connect this chip to the insulating ribbon have a thickness of several tens of microns.

Figure 2:
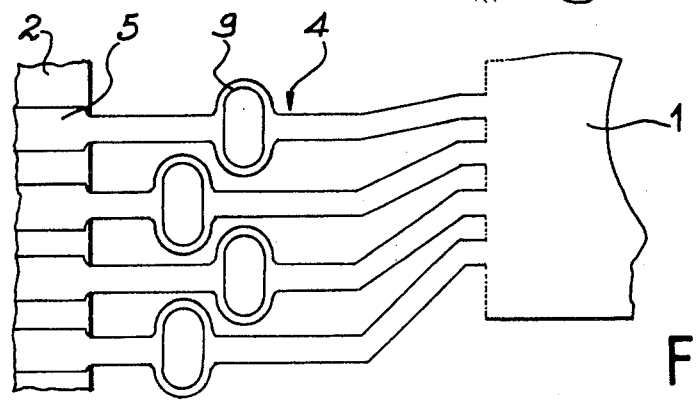
FIG. 2 shows a structure for decreasing mechanical forces mounted on each conductor connecting the chip to the perforated ribbon.

FIG. 2 shows a structure for decreasing the mechanical forces to which the conductors are subjected during bending. This strucuture is constituted in known manner by rings 9 connected on one side to conductors 4 and disposed adjacent the edge of the opening in ribbon 2 at the center of which is the chip 1. As will be seen, the contacts are formed in the portions of the conductors 4 which extend between the edge of the ring 9 and the corresponding points of the chip.

Figure 3:
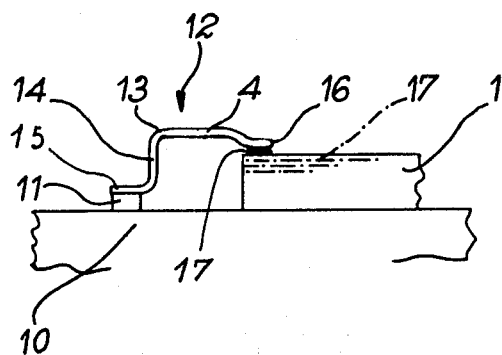
FIG. 3 shows the contact formed in the conductor between the chip and a contact point of a printed circuit on a connection substrate.

FIG. 3 shows schematically the connection between contact 12 for chip 1 and a contact point 11 of a connection plate or substrate 10 constituted, for example, by a printed circuit card or other suitable substrate. As will be seen later on, each of the contacts formed by the machine of the invention is formed with a bend 13 followed by a linear part 14 in a direction substantially perpendicular to the plane of the chip. This linear part connects with the portion 15, which in turn is affized to contact point 11. There is represented at 17 the point of connection of a connector on the integrated ciruit chip. Bend 13 connects to the portion of the conductor which extends to point 17.

Figure 4:
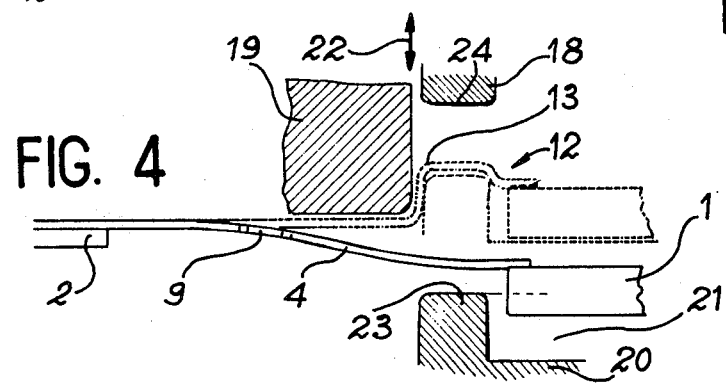
FIG. 4 shows schematically the manner of bending the contacts adjacent the chip.

FIG. 4 shows schematically a part of the movable means for bending the contacts of the chip. These movable bending means are notably constituted by a first movable piece 18 and by a second movable piece 19. The first movable piece is situated with respect to the bending base 20 which has a recessed housing 21, the periphery of which has the form of the periphery of chip 1 and the depth of which is adapted to the thickness of the chip. Also shown in this figure, is one of the conductors 4 which connects the chip to the support or insulating ribbon 2. The first and second movable pieces 18, 19 can be displaced in a direction perpendicular to the surface of the chip in one of the two opposed directions indicated by the double arrow 22. Also as appears from the figure, the bending base 20 has a plain rim 23. Piece 20 has a plain rim 24 opposite to rim 23. During bending, rim 24 of the first movable piece wedges the contacts of the chip at the vicinity of the perimeter thereof as shown by interrupted lines on the figure. A second movable piece 19 surrounds the first piece 18 in a way to bend the conductors to form the contacts of the form described above. The bend 13 takes the exterior shape of rim 23 of base 20. During bending, the solder between the extremities of the conductors 4 and the contact points of the chip 1 are not subjected to any substantial force because the conductors are wedged between the first movable piece 18 and base 20. The forces to which the conductors are subjected during bending appear beneath the surface of contact between the conductors 4, the first movable piece 18 and base 20 at the side of the first movable piece 19. These forces are absorbed by the rings 9.

Figure 5:
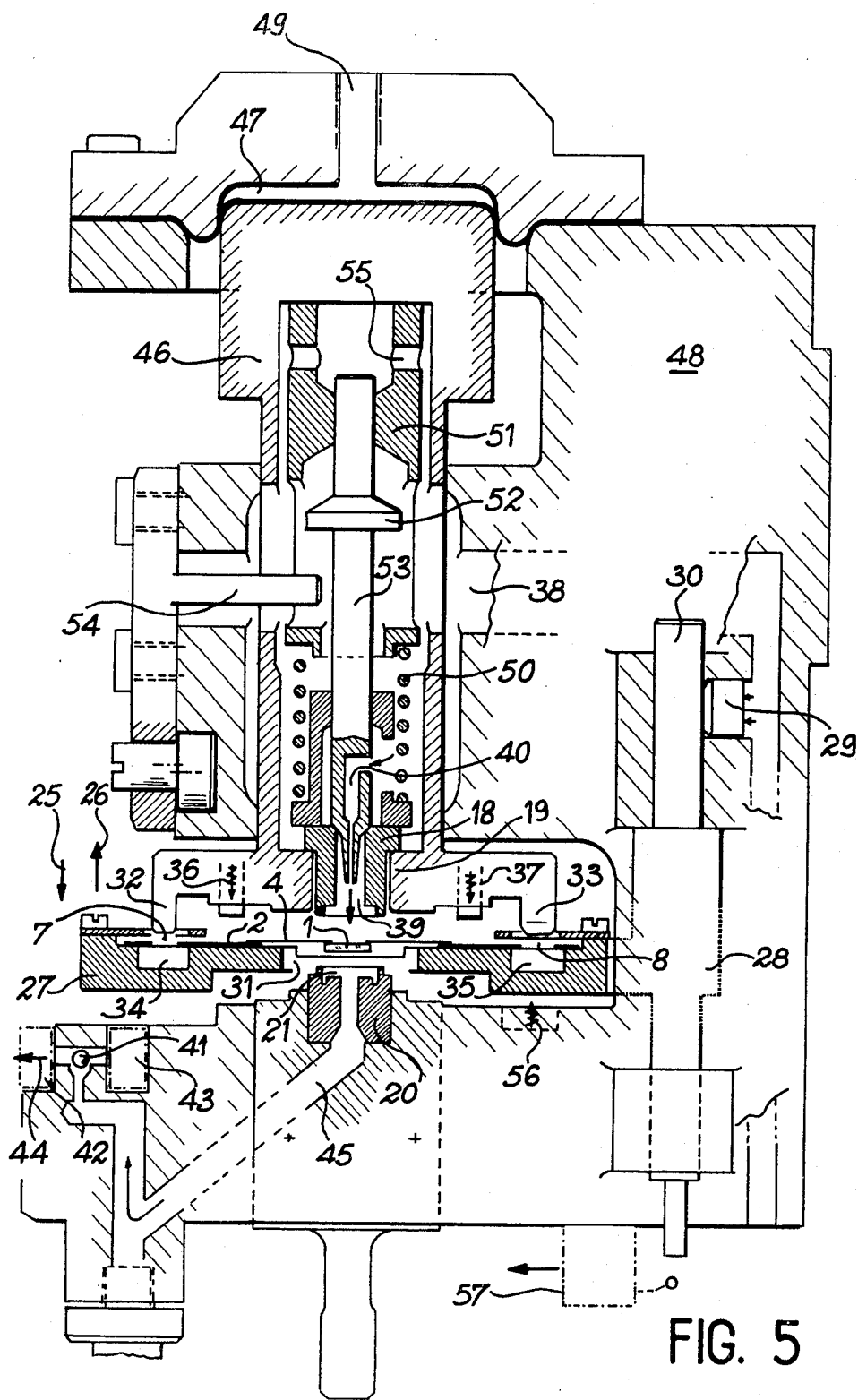
FIG. 5 represents schematically and in section the automatic bending machine in accordance with the invention.

FIG. 5 is a longitudinal section of the automatic bending machine in accordance with the invention. In this figure, the same reference characters designate the same elements as in the preceding figures. There is seen in this figure the bending base 20, a chip 1 connected by conductors 4 to ribbon 2 for which the lateral perforations appear at 7 and 8. The first movable bending piece is designated at 18, while the second movable piece is shown at 19 and will be described hereinafter in detail. This machine is associated with means for movement of the ribbon or support for the chips in a linear direction perpendicular to the plane of the figure to bring successively each chip opposite base 20. These means are not shown in the figure and will be described with reference to FIG. 9. They are principally each made up of driving apparatus which act on the lateral perforations 7 and 8 to move the ribbon in the linear direction step by step. This machine also comprises means for displacing the support for the chips and to bring each chip on the base, in a direction perpendicular to the chip, in the direction of the arrow 25. The chip is removed from the base after bending in the direction of arrow 26. A platform 27 guides ribbon 2 and includes linear guiding means 28 for movement in the direction perpendicular to the chip. The linear movement is improved by reason of means constituted by a pneumatic jet 29 acting on the linear guide 30 and by elastic means 56 (a spring for example) situated between the platform 27 and the base 48. Platform 27 has an opening 31 opposite the bending base. The second movable bending piece 19 has extensions 32, 33 which engage in lateral perforations 7, 8 of band 2 adjacent each chip which is positioned opposite bending base 20. These extensions also engage in lodgings 34, 35 in platform 27.

The second bending piece 19 also comprises elastic means 36, 37 such as a spring for placing the ribbon 2 on platform 27 during movement of the first and second bending pieces 18, 19 in the direction of arrow 25, during the bending operation. These elastic means also permit the ribbon to be held against the platform 27 during the displacement of the first and second bending pieces, in the direction of the arrow 26, after bending, until the extensions 32, 33 are disengaged from perforations 7, 8 of ribbon 2. These elastic means are made up of finger springs shown schematically in the figure. These fingers act, it will be understood, in a direction perpendicular to chip 1.

The machine also comprises pneumatic means for precisely positioning the chip 1 on the bending base and, more precisely, in the mounting 21 of the base. The means which position the chip on base 20 further comprise automatic means which permit monitoring and control of the presence of the chip on the base, the positioning of the chip on the base, as well as its state or condition. These control means are situated in the first movable piece 19 and are of pneumatic type.

In particular, these pneumatic means comprise a first duct 39 and a second duct 40 located coaxially within the first duct 39. The orifice opening of the second duct 40 has an area less than the area of the opening of the first duct 39; accordingly, the gas jet pressure applied to the chip 1 by the second duct 40 is less than the pressure applied by the first duct 39. As explained in greater detail hereinafter, in the operational sequence gaseous fluid is initially applied through the second duct 40 at relatively lower pressure for the dual purposes of positioning the chip 1 within the recess 21 on the base, and for enabling the presence of the chip 1 to be monitored. At this point the first duct 39 is blocked. If a chip is not present, then automatic operation stops. Assuming the chip 10 is present, the operational sequence continues with the application of gaseous fluid through the second duct 39 at relatively higher pressure for the dual purposes of further positioning the chip 1, and for enabling the detection of an improperly-positioned chip or a damaged chip having, for example, a crack.

Cooperating with both the first duct 39 and the second duct 40 is a pressure detector comprising a lower conduit 45 communicating at one extremity with the recessed housing 21, a ball 41 located at the other extremity of the conduit 45, and an infrared beam object detector 42, 43 having an output 44. Gaseous fluid pressure within the lower conduit 45 displaces the ball 41 upwardly as shown in FIG. 5, and this movement of the ball 41 is detected by the infrared beam object detector 42, 43.

Thus, the pressure detector serves to detect all incidents concerning the chip 1. If the chip 1 is not present in the recess 21 within the base 20, then gas jet pressure from the second duct 40 causes pressure within the lower conduit 45 to increase, which moves the ball 41. This movement is detected by the infrared beam object detector 42, 43, the output 44 of which provides a signal indicating the incident. Similarly, if the chip 1 is present but is improperly positioned or cracked, then gas jet pressure from the first duct 39 causes pressure within the lower conduit 45 to increase, and ultimately a signal is provided at output 44. In either case, the signal is applied to a controller 60, described hereinafter with reference to FIG. 9, which operates to prevent the descent of the first and second bending pieces. It also controls the means which act on the displacement of the ribbon or support of the chips, so that in case of an incident, another chip will not be brought opposite base 20.

Finally, the machine comprises pneumatic means for control of displacement of the first and second movable pieces 18, 19 in a direction perpendicular to the chip.

These means of control of displacement of the first and second movable bending pieces are constituted by a piston 46 received in an air chamber 47 and which moves in the base 48 of the machine. The lower extremity of this piston is connected to the second bending piece 19. The air chamber 47 is fed with gaseous fluid under pressure by conduit 49. Elastic means constituted by spring 50 are interposed between the first and second bending pieces 18, 19. This spring which bears on the first piece 18 and on an intermediate piece 51 contained in the piston 46, applies to the first piece 18, a force opposing the relative movement of the first piece with respect to the second piece. It forces the flat rim of piece 18 on the flat rim of base 20, to thereby wedge the conductors during bending.

However, before bending, a relatively lower pressure jet of gaseous fluid from the second duct 40 is employed to monitor for the presence of the chip 1, in cooperation with the pressure detector as described above. At this time, the first duct 39 is closed by virtue of the stepped conical, outer portion near the extremity of the second duct 40 being in contact with the beveled upper perimeter of the first duct 39.

Assuming a chip is present, then the movable pieces 18, 19 are displaced in the direction of arrow 25. Prior to the first movable piece 18 coming in contact with base 20, thus wedging conductors 4, a shoulder 52 of the rod 53 containing duct 40, comes in contact with the stop 54. The position of this rod, in height, with respect to base 20 can be regulated by eccentric 5. When the shoulder 52 is in contact with stop 54, the second duct 40 is prevented from further downward movement, while the first movable piece 18, also comprising the first duct 39, continues to move downwardd to open an annular gap between the stepped, conical outer portion of the second duct 40 and the beveled upper perimeter of the first duct 39. Gaseous fluid then jets from the first duct 39 to position the chip 1 in the housing recess 21 and to enable proper positioning and the condition of the chip 1 to be monitored in cooperation with the pressure detector as described above.

Openings 55 in piece 51 regulate the pressure within the hollow part of piston 46. Shown at 57 are means for adjusting the position of the platform 27 when the platform has brought the chip into bending position on base 20. These means can be constituted in known manner by a contact acting on a relay.

Figure 6:
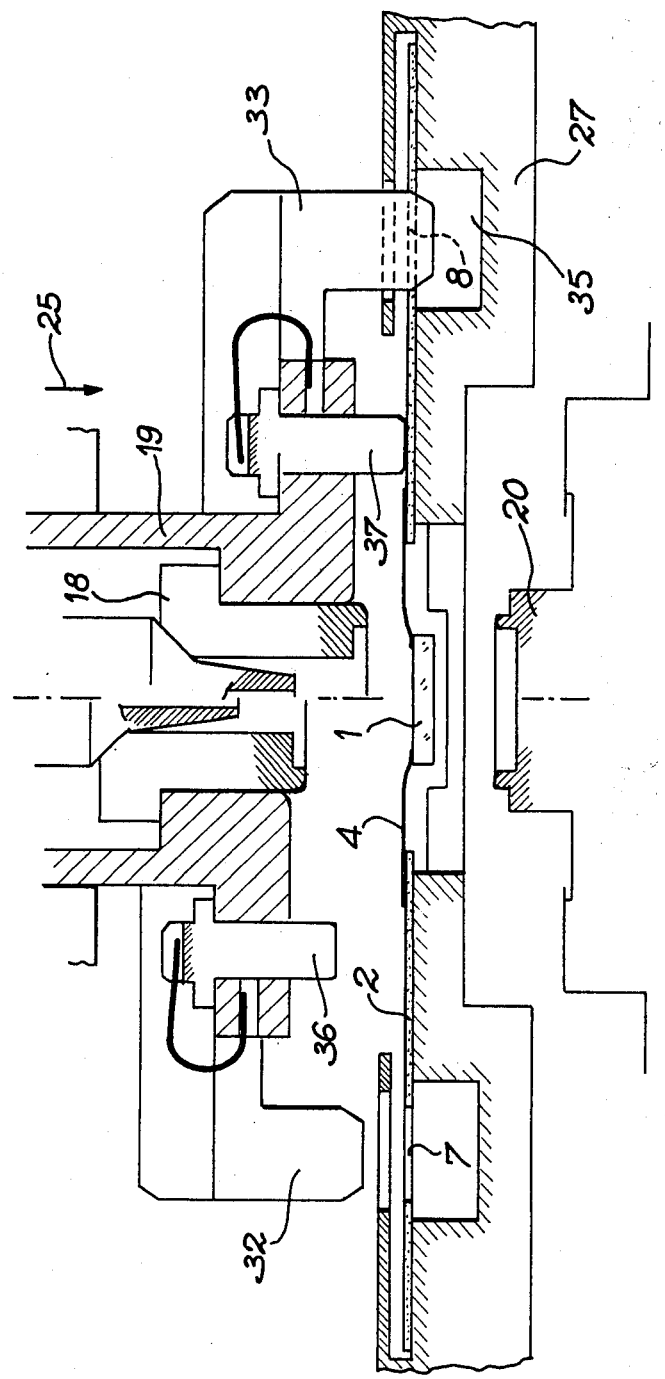
FIG. 6 shows schematically and in section certain parts of the machine of the invention in the positions that they occupy at the beginning of the bending operations.

FIG. 6 shows schematically the positions of the movable bending pieces 18, 19 and of the platform 27, with respect to the base with fixed position 20, at the beginning of the bending operations forming the contacts in the conductors connecting the chip 1 on the support band 2. Seen at the left of the figure are the initial positions of these elements while the chip 1 comes into position with respect to base 20. The extensions 32 are not yet engaged in perforations 7 of the support band 7, the fingers 36 do not yet touch the band, and the platform 27 is not yet moved in direction of support 20. On the right side of this figure there is shown the same elements as above, but the movable pieces 18, 19 have started their descent movement in the direction of base 20, in the direction of the arrow 25. Finger 37 is in contact with support or ribbon band 2, while the part 33 at extension of movable piece 19 is engaged in the perforation 8 of the support band 2 and in the housing 35 of platform 27 which is then in its initial position, braked by the means 29 and 56 of FIG. 5.

Figure 7:
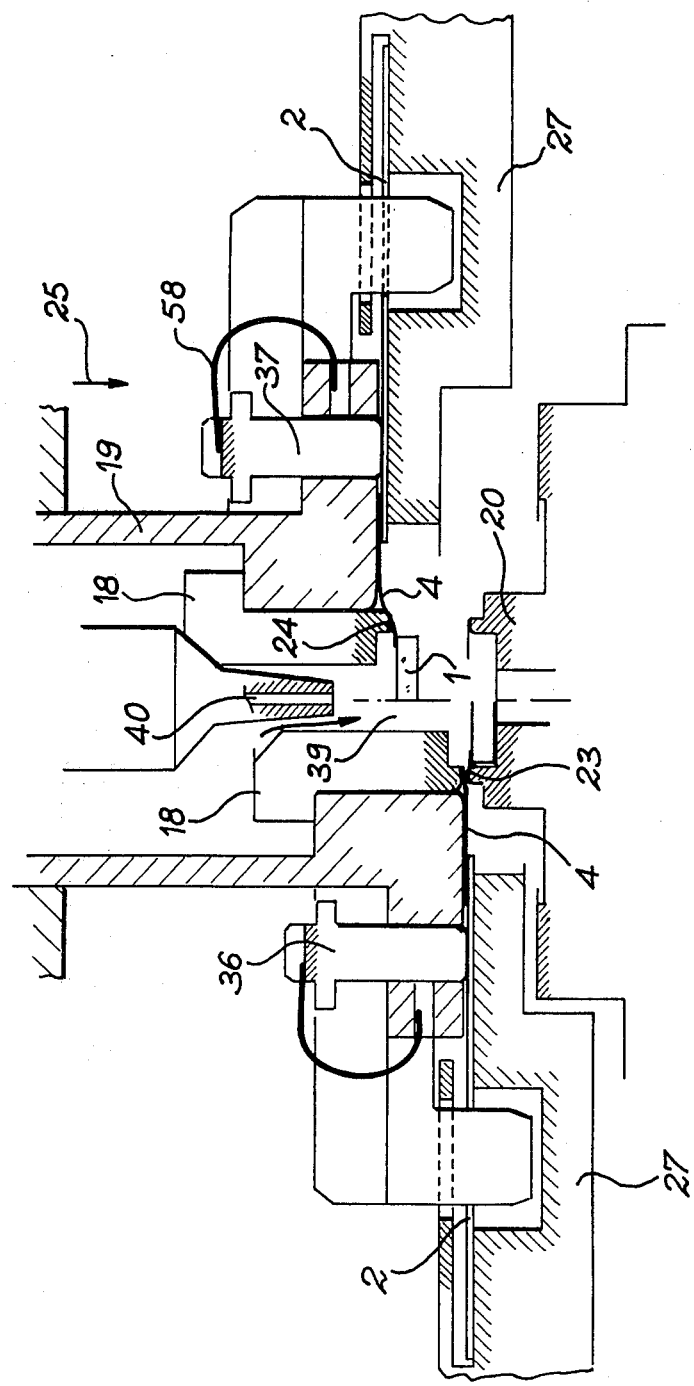
FIG. 7 shows the preceding parts in the positions that they occupy during the bending operations.

FIG. 7 shows schematically and respectively at the right and at the left sides, the positions of the preceding elements, during their successive following operations. The first of these operations, represented on the right part of the figure shows that the movable pieces 18 and 19 are in contact with conductors 4 of chip 1, because of the displacement of these pieces in the direction of the arrow 25. Finger 37, subjected to the recall force of spring 58, is in contact with ribbon support 2 and thus, places the ribbon support on the upper face of plate 27. Plate 27 begins its displacement in direction of base 20. This displacement is braked by damping means 29 and 56, seen in FIG. 5. On the left hand side of the figure, the following operation is represented: finger 36 is always in contact with ribbon support 2, in such a way as to hold the ribbon on plate 27. Conductor 4 comes in contact with edge 23 of base 20, and the portion of the conductor located between this edge and the first movable piece 18, begins to be wedged between base 20 and movable piece 18. Chip 1 is then in position over the housing in support 20. The extremity of air duct 40 is then disengaged from the circumference of air duct 39 in such a way that a jet of gaseous fluid is applied to chip 1, the jet of gaseous fluid under pressure from duct 39 positioning and maintaining chip 1 in the bottom of the housing in base 20.

Figure 8:
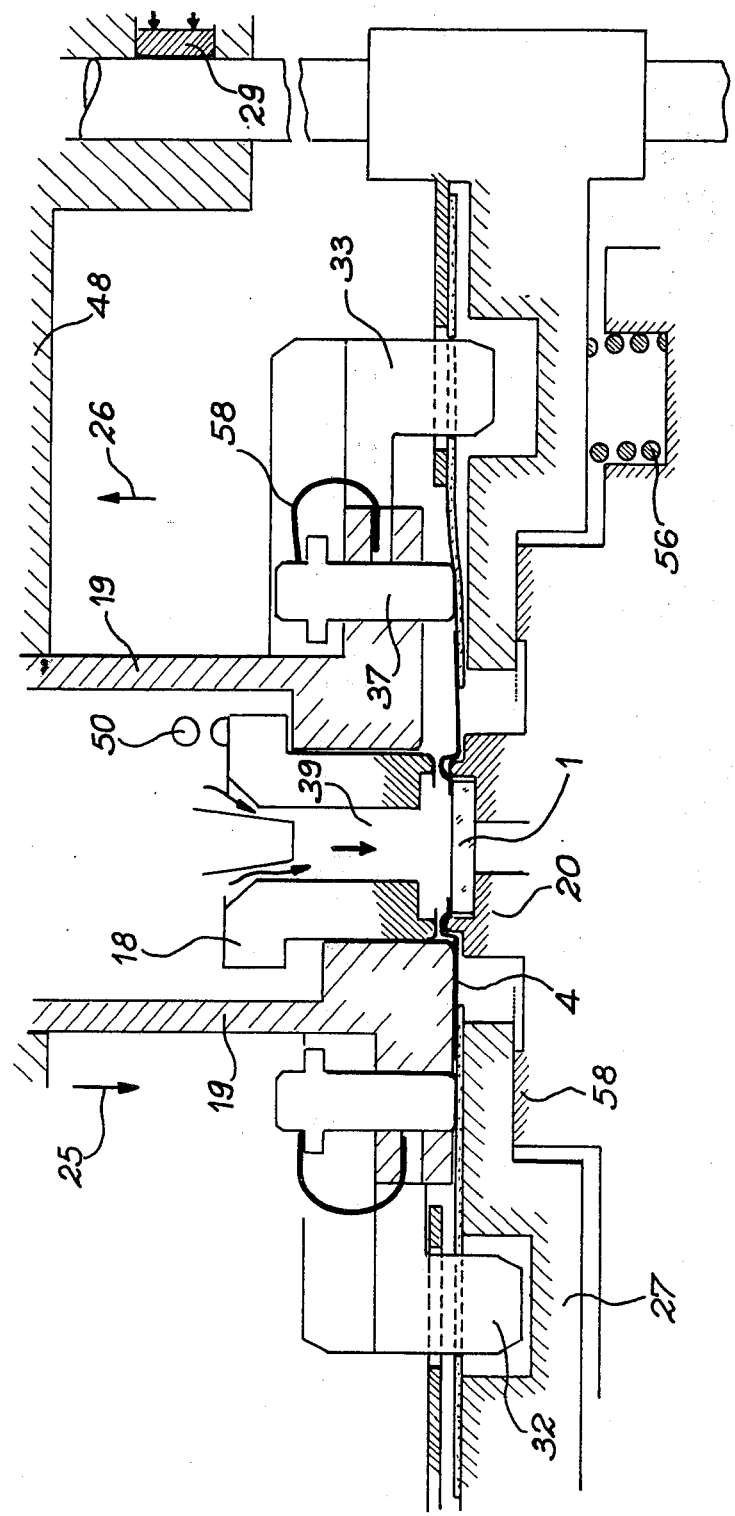
FIG. 8 shows the preceding parts in the positions that they occupy during the bending and when the bending is going to be completed.

FIG. 8 shows on the left hand side, the positions of the preceding elements during the bending operation. The first piece 18, urged by spring 50, wedges the conductors 4 between their extremity and the flat rim of base 20 while the second movable piece 19 and plate 27 continue their movements in the direction of the base, in the sense of the arrow 25. During this operation, the conductors 4 which are wedged between base 20 and the first movable piece 18, because of the movement of the second movable piece 19, undergo a bending around the rim of base 20, in the manner described above. It is understood that the gaseous fluid under pressure continues to be applied on chip 1 through duct 39. During this operation, the movement of platform 27 is constantly resisted by the automatic brake 29 and by spring 56. At the end of bending, platform 27 arrives at a top on the part 58 of base 48 connected to base 20. The end of movement of platform 27 having been detected by detector 57, one validates the control for good positioning of the chip and its state. After this control check, the arrival of gaseous fluid under pressure in the ducts 39 and 40 are well as in conduit 49 is stopped. In FIG. 8 and the right part thereof, the following operation is shown: the contacts having been bent in the manner described above while the movable pieces 18 and 19 commence their return movement in the direction of arrow 26. Finger 37, urged by spring 58, prevents the support band 2 from being elongated too rapidly by platform 27 while the extensions 33 of the second movable piece 19 are not disengaged from the lateral perforations of the support band. During all this return, platform 27 is urged upwardly because of spring 56 of which the elastic force is less than the elastic force of springs 58. In effect, it is necessary that the support band be maintained partially in contact with platform 27 during the upward movement of piece 19 because the extension 33 which is engaged in the corresponding perforation of the support band could eventually move this band upwardly and deform the bending of the contacts. The return movement of movable pieces 18, 19 and of platform 27 to their initial position has not been shown in detail; in fact, beginning with this last operation which has just been described, this return is carried out in a simple manner; the extensions 32 and 33 are disengaged from corresponding perforations in the support band 2, platform 27 urged by spring 56 moves upwardly, and the chip 1 whose contacts have been bent is disengaged from the lodging in support 20; the platform as well as the movable pieces 18, 19 reaching their initial position while another new chip can be moved opposite base 20.

Figure 9:
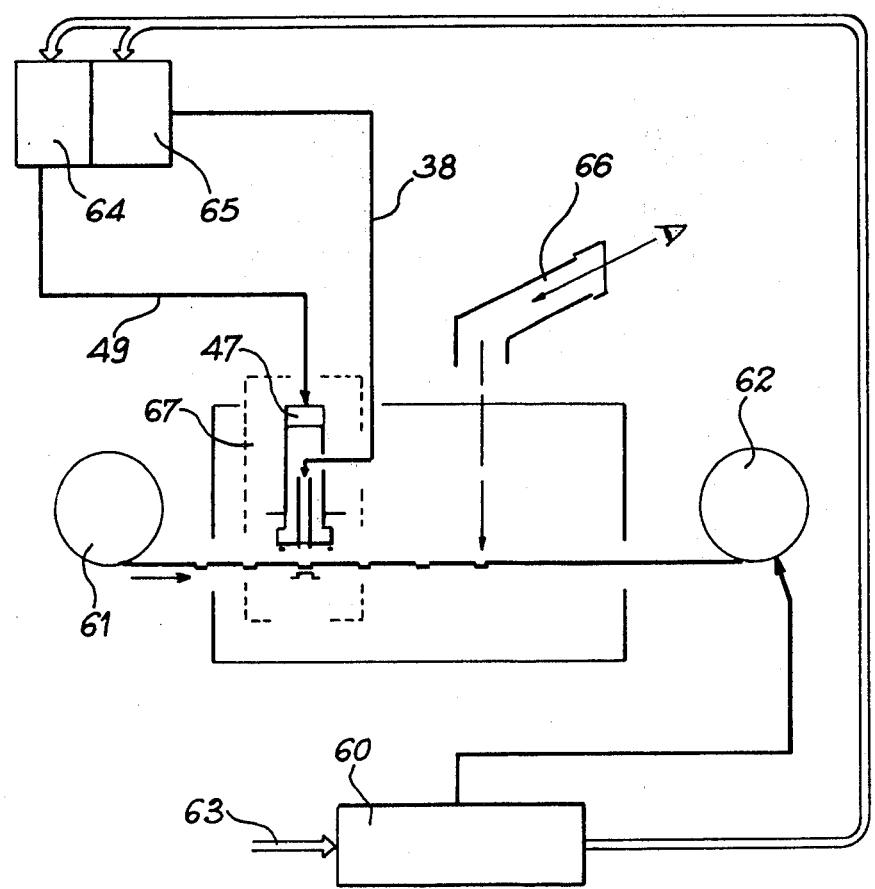
FIG. 9 shows schematically the principal control means of the machine of the invention.

FIG. 9 shows schematically the different control means which are associated with the machine of the invention. These control means are not a part of the invention per se and are not described herein in detail. In this figure there has been shown at 60 an assembly for synchronization of the different functions of the machine. This assembly controls the step by step advance of ribbon 2 carrying chips 1 to bring each of these chips successively opposite base 20. In known way, this ribbon unrolls from a reel 61 and is rolled up on a reel 62. A synchronization assembly recives at its input 63, various signals provided for example by relay 57 of FIG. 5 or from the detector 42, 43 which controls the positioning of the chips with base 20. This synchronization assembly also controls pneumatic means 64, 65 which feed on the one hand the air chamber 47 through conduit 49 and on the other hand the ducts 39, 40 (FIG. 5), through conduit 38. There has been shown in schematic manner at 66 a microscope for verification of the bending results of each of the chips, after passage in the automatic machine conforming to the invention and which is represented schematically at 67.

I claim:

1. In a machine for bending the extending conductors of an integrated circuit chip (1) to form contacts (12) for mounting of the chip to a connection substrate (10), said chip being preliminarily mounted on an insulating support (2) provided with at least one opening (3) at the center of which the chip is located, conductors (4) extending across the opening and connecting points of contact (17) of the chip (1) with the conductors (4) on the insulating support (2) while supporting the chip (1) in the opening (3), each said conductor having a connector section represented by a part of the conductor (4) which extends from the corresponding contact point (17) of the chip (1) to the neighborhood of a force relieving structure (9) connected with conductor (4) and located adjacent the edge of the opening (3), said machine comprising a bending base (20), movable bending means disposed opposite the base (20), means (27) for displacing the insulating support for the chips and for bringing each chip onto the base (20) in a first direction (25) perpendicular to the chip (1), and to remove the chip after bending, in the said perpendicular direction, but in a second direction (26) opposed to the first direction, and means (39, 40) for positioning the chip on the base, the improvement comprising the bending base (20) having a recessed housing (21) the circumference of which is slightly greater than the circumference of the chip (1) for receiving the chip and a plane rim (23) adapted to engage the contacts (12) to be bent adjacent the circumference of the chip, and the movable means for bending including a first movable poiece (18) movable within a second piece (19) in the said perpendicular direction and in the first and second directions, said first movable piece (18) being situated opposite the base (20) and having a plane rim (24) corresponding to the plane rim (23) of the base, and adapted to be positioned so as to wedge the contacts (12) of the chip (1) adjacent the circumference of the chip during bending of the conductors, and the second piece (19) being movable in said perpendicular direction and in the two directions, said second movable piece (19) surrounding the first piece (18) and adapted to bend the conductors (4) to form the contacts (12) for each of which to have a bend (13) which takes the form of the outline of the rim (23) of the base (20) and a linear part (14) connected to said bend (13) in a direction substantially perpendicular to the chip, forming said linear part for connecting in continuous manner with the remaining portion (15) of the conductor (4) situated between said linear part and the insulating support (2), and elastic means (50) interposed between the first and second pieces to apply to the first piece (18) a force opposing the relative movement of the first piece (18) with respect to the second piece (19).

2. A machine in accordance with claim 1, wherein the means (39, 40) to position the chip (1) on the bending base (20) comprise pneumatic means (39) for monitoring the condition and the position of the chip situated in the first piece (18) and applying a jet of gaseous fluid under pressure capable of adjusting the position of the chip (1) in its housing (21).

3. A machine in accordance with claim 2, wherein the means (39, 40) to position the chip on the base comprises pneumatic means (40) for monitoring the presence of a chip in the housing (21).

4. A machine in accordance with claim 1, wherein the means (39, 40) to position the chip on the base comprises pneumatic means (40) for monitoring the presence of a chip in the housing (21).

5. A machine in accordance with claim 3, wherein the pneumatic means for monitoring the presence of a chip includes pneumatic means (40) arranged to apply on the chip a jet of gaseous fluid, the pressure of which is less than that of the jet of gaseous fluid for monitoring the condition and the position of the chip.

6. A machine in accordance with claim 5, wherein the pneumatic means (40) for monitoring the presence and the pneumatic means (39) for monitoring the condition and position of the chip further comprise a pressure detector connected to the recessed housing (21) of the base for detecting a level of pressure indicative of the chip (1) being improperly positioned within the recesses of the housing (21) of the base (20).

7. A machine in accordance with claim 5, wherein the pneumatic means (40) for monitoring the presence and the pneumatic means (39) for monitoring the condition and position of the chip further comprise a pressure detector connected to the recessed housing (21) of the base for detecting a level of pressure indicative of the chip (1) being absent from the recessed housing.

8. A machine in accordance with claim 5, wherein the pneumatic means (40) for monitoring the presence and the pneumatic means (39) for monitoring the condition and position of the chip further comprise a pressure detector connected to the recessed housing (21) of the base for detecting a level of pressure indicative of chip damage.

9. A machine in accordance with claims 6, 7 or 8 wherein said detector (42, 43) has its output (44) connected to means (60, 62) for displacing the support of the chips to stop the machine in case of a detected incidence.

10. A machine in accordance with claim 9 wherein the support (2) of the chip is constituted by a flexible insulating inextensible ribbon provided with lateral perforations (7, 8) adapted to cooperate with means (61, 62) for movement of the ribbon, the openings (3) in which the chips are located being arranged in a linear direction parallel to the edges of the ribbon (2), the means (61, 62), which permit movement of the ribbon support adapted when actuated to act on the lateral perforations (7, 8), and displace the ribbon (2) in said linear direction and to bring, successively, each chip (1) onto the base (20), the means (27) for bringing the chip on the base comprising a platform (27) for positioning of the ribbon, said platform having guiding means (28, 30) for linear movement with movement of the chip in the said perpendicular direction (25, 26) and having an opening (31) opposite the housing (21) of the base (20), the second movable bending piece (19) having extensions (32, 33) to engage in the perforations (7, 8) of the ribbon (2) adjacent to each chip (1) situated on the base (20), and to engage in housings (34, 35) in the platform (27) for positioning the chip and its support with respect to these extensions, said second bending piece (19) further comprising elastic means (36, 37) to hold and position the ribbon (2) on the platform (27) during the displacement of the first and second pieces (18, 19) in the first direction (25) and during displacement of these pieces in the second direction (26), while the extensions (32, 33) are disengaging from the perforations (7, 8) after the conductors have been bent.

11. A machine in accordance with claim 1 wherein detector (42, 43) has its output (44) connected to means (60, 62) for displacing the support of the chips to stop the machine in case of a detected incidence.

12. A machine in accordance with claim 10 wherein the guiding means (28, 29, 30) for movement of the platform (27) comprises a linear guide (30) connected to said platform (27) and arranged parallel to the said perpendicular direction of movement of the chip, and elastic means (56) for restraining the movement, said elastic means being disposed between the platform and a second base (48) connected to the base (20).

13. A machine in accordance with claim 12, wherein the restraining means comprise further an automatic brake (29) acting on the linear guide (30).

14. A machine in accordance with claim 10, wherein the elastic means (36, 37) for holding the ribbon (2) on the positioning platform (27) comprise finger supporting springs mounted in the second movable piece (19) and acting in the said perpendicular direction of movement of the chip.

15. A machine in accordance with claim 10, including pneumatic means (47) for actuation of the displacements of the first and second movable pieces (18, 19).

16. A machine in accordance with claim 10 wherein the pneumatic means for monitoring the condition and the position (39) is located partly in the first movable piece (18) and comprises a first duct (39) formed in the first movable piece and fed with said gaseous fluid under pressure.

17. A machine in a accordance with claim 16 wherein the pneumatic means for monitoring the presence of a chip by pressure of gaseous fluid comprises a second duct (40) situated in the first duct (39) having an orifice of smaller dimension than that of the first duct and fed by the same gaseous fluid under pressure, the housing (21) of the base (20) having a conduit (45) connecting the housing to the pressure sensitive receiver (41).

* * * * *